(12) United States Patent
Chang et al.

(10) Patent No.: US 11,895,918 B2
(45) Date of Patent: Feb. 6, 2024

(54) ORGANIC SEMICONDUCTOR MIXED MATERIAL AND ORGANIC PHOTOVOLATIC DEVICE USING THE SAME

(71) Applicant: Raynergy Tek Inc., Hsinchu (TW)

(72) Inventors: Yi-Ming Chang, Hsinchu (TW); Chia-Hua Li, Hsinchu (TW); Huei-Shuan Tan, Hsinchu (TW)

(73) Assignee: RAYNERGY TEK INC., Hsinchu (TW)

( * ) Notice: Subject to any disclaimer, the term of this patent is extended or adjusted under 35 U.S.C. 154(b) by 328 days.

(21) Appl. No.: 16/934,747

(22) Filed: Jul. 21, 2020

(65) Prior Publication Data
US 2021/0043853 A1   Feb. 11, 2021

Related U.S. Application Data

(60) Provisional application No. 62/884,348, filed on Aug. 8, 2019.

(51) Int. Cl.
*H01L 31/00*   (2006.01)
*H10K 85/60*   (2023.01)
(Continued)

(52) U.S. Cl.
CPC ......... *H10K 85/6576* (2023.02); *H10K 30/30* (2023.02); *H10K 85/215* (2023.02);
(Continued)

(58) Field of Classification Search
CPC ............. H10K 85/6576; H10K 85/621; H10K 85/657; H10K 85/215; H10K 85/626; H10K 85/40; H10K 30/30
See application file for complete search history.

(56) References Cited

U.S. PATENT DOCUMENTS

2013/0237676 A1* 9/2013 Hsu ................ C08G 69/40
                                                           526/240
2016/0233448 A1   8/2016 Yang

FOREIGN PATENT DOCUMENTS

CN   105705610 A   6/2016
CN   105705610 B   1/2018
(Continued)

OTHER PUBLICATIONS

Wang et al., "Insight Into the Role of PC71BM on Enhancing the Photovoltaic Performance of Ternary Organic Solar Cells", Frontiers in Chemistry, Jun. 2018, vol. 6, Article 198, pp. 1-8. (Year: 2018).*

(Continued)

*Primary Examiner* — Thanh Truc Trinh
(74) *Attorney, Agent, or Firm* — WPAT, P.C.

(57) ABSTRACT

Organic photovoltaic device comprises a first electrode, a first carrier transfer later, an active layer, a second carrier transfer layer and a second electrode. The first electrode is a transparent electrode. The active layer includes at least one electron donor, a first electron acceptor, and a second electron acceptor. Wherein, the electron donor is an organic polymer. The first electron acceptor is a crystalline material, and the self-molecule stacking distance of the first electron acceptor is less than 4 Å. The second electron acceptor is a crystal destruction material, and the second electron acceptor includes a fullerene derivative. The organic photovoltaic device of the present invention not only has a controllable morphology formation but also can enhance fill factor and improve power conversion efficiency.

10 Claims, 7 Drawing Sheets

(51) Int. Cl.
H10K 30/30 (2023.01)
H10K 85/40 (2023.01)
H10K 85/20 (2023.01)

(52) U.S. Cl.
CPC ........... H10K 85/40 (2023.02); H10K 85/621 (2023.02); H10K 85/626 (2023.02); H10K 85/657 (2023.02)

(56) References Cited

FOREIGN PATENT DOCUMENTS

| | | | |
|---|---|---|---|
| CN | 109456465 A | | 3/2019 |
| EP | 3144990 A1 | | 3/2017 |
| WO | WO 2018/099492 | * | 6/2018 |
| WO | WO2019123267 A1 | | 6/2019 |

OTHER PUBLICATIONS

Yao et al., "Critical Role of Molecular Electrostatic Potential on Charge Generation in Organic Solar Cells", Chin. J. Chem. 2018, 36, 491-494. (Year: 2018).*

Yuan et al., "Single-Junction Organic Solar Cell with over 15% Efficiency Using Fused-Ring Acceptor with Electron-Deficient Core", Joule 3, 1140-1151, Apr. 17, 2019. Published: Jan. 17, 2019. (Year: 2019).*

Chen et al., "Single-Junction Organic Solar Cell Containing a Fluorinated Heptacyclic Carbazole-Based Ladder-Type Acceptor Affords over 13% Efficiency with Solution-Processed Cross-Linkable Fullerene as an Interfacial Layer", ACS Appl. Mater. Interfaces 2019, 11, 31069-31077. (Year: 2019).*

Naveed et al., "Miscibility-Driven Optimization of Nanostructures in Ternary Organic Solar Cells Using Non-fullerene Acceptors", Joule 2, 621-641, Apr. 18, 2018. (Year: 2018).*

Mengxue Chen et al., "Influences of Non-fullerene Acceptor Fluorination on Three-Dimensional Morphology and Photovoltaic Properties of Organic Solar Cells", ACS Appl. Mater. Interfaces 2019, 11, 26194-26203. (Year: 2019).*

Taiwan Intellectual Property Office, "2nd Office Action" dated Feb. 16, 2022.

Taiwan Intellectual Property Office, "Office action", dated Mar. 19, 2021.

Wang et al. "Improvement of Exciton Collection and Light-Harvesting Range in Ternary Blend Polymer Solar Cells Based on Two Non-Fullerene Acceptors", Jan. 29, 2020, MDPI.

China Patent Office "Office Action" dated Aug. 12, 2023, China.

* cited by examiner

D1:IT-4F

D1:IT-4F:PCBM

D2:Y6

D2:Y6:PCBM

D3:DTSC

D3:DTSC:PCBM

ORGANIC SEMICONDUCTOR MIXED MATERIAL AND ORGANIC PHOTOVOLATIC DEVICE USING THE SAME

The present application is based on, and claims priority from, America provisional patent application number U.S. 62/884,348, filed on 2019 Aug. 8, the disclosure of which is hereby incorporated by reference herein in its entirety.

BACKGROUND OF THE INVENTION

Field of the Invention

The present invention relates to an organic semiconductor mixed material applied to an organic photoelectric device, and an organic photoelectric device including the said organic semiconductor mixed material.

Description of the Prior Art

In view of global warming, climate change has become a common challenge in the international communities. The Kyoto protocol proposed by the "United Nations Framework Convention on Climate Change (UNFCCC)" in 1997 which had entered into force in 2005 is aimed at reducing carbon dioxide emissions. In this regard, countries are focusing on the development of renewable energy to reduce the use of petrochemical fuels. As the sun provides far enough energy needs of people at present and for the future, renewable energy becomes a major concern for solar power generation, which has led to the use of organic photoelectric devices for solar power generation as the primary development target.

Compared with the existing silicon-based organic photoelectric devices, the new type of organic photoelectric devices is not only cheap in production cost and light weight, but also can be thin, transparent and flexible as plastic films, so that the new type of organic photoelectric devices is suitable for making various shapes. The organic photoelectric devices can be widely used in communication, architecture, transportation, lighting, fashion and other fields. Therefore, the new generation of organic photoelectric devices not only contributes to environmental protection during global climate change, but also has great economic potential.

Organic photoelectric devices can utilize bulk heterojunction (BHJ) structures as the devices with basic application characteristics. In a recent research report, the maximum power conversion efficiency (PCE) of BHJ organic photoelectric devices combining a low-bandgap conjugated polymer crystal with a fullerene derivative is 8%. The morphology of the active layer in such BHJ organic photoelectric devices plays a key role in the overall performance of the device. The phase separation region in the active layer can provide a way for the charge separation carriers of the interface photogenerated excitons to be transmitted to their corresponding electrodes and must still have a relatively sufficient amount of heterojunction to provide excitons separation.

The active layer of existing organic photoelectric devices is mostly binary blended materials. However, because the organic photoelectric devices are limited by the "narrow absorption" characteristics of the organic materials, it is difficult for the organic photoelectric devices made of the binary blended materials to effectively utilize the broad spectrum of the solar energy, and there is always contradictory between phase blending (favorable to exciton dissociation) and phase separation (favorable for charge transport), which in turn restricts the performance development of the organic photoelectric devices. In this regard, the ternary organic photoelectric device formed by introducing the third component of the complementary absorbing spectrum into the binary active layer can effectively enhance the spectral absorption, and thus solve the contradictory blending problem of the binary blended material.

However, the current ternary organic photoelectric devices are faced with the problems of difficulty in controlling morphology and maintaining high-efficient excitons dissociation and charge transport at same time. As a result, the power conversion efficiency (PCE) and fill factor (FF) of the organic photoelectric devices are difficult to be effectively improved at the same time. Therefore, how to provide an organic semiconductor mixed material with controllable active layer morphology, high power conversion efficiency and high fill factor, and an organic photoelectric device using the same are an important issue at present.

SUMMARY OF THE INVENTION

In view of this, one category of the present invention is to provide an organic semiconductor mixed material to break through the power conversion efficiency of the prior art and solve the ternary organic photoelectric device. According to a specific embodiment of the present invention, the organic semiconductor mixed material comprises at least one electron donor, a first electron acceptor and a second electron acceptor. Wherein, the electron donor is an organic polymer. The first electron acceptor is a crystalline material and the self-molecule stacking distance of the first electron acceptor is less than 4 Å. The second electron acceptor is a crystal destruction material, and the second electron acceptor includes a fullerene derivative.

Wherein, the first electron acceptor includes IT-4F (3,9-bis(2-methylene-((3-(1,1-dicyanomethylene)-6,7-difluoro)-indanone))-5,1,11-tetrakis(4-hexylphenyl)-dithieno[2,3-d:2',3'-d']-s-indaceno[1,2-b:5,6-b']dithiophene).

Wherein, the first electron acceptor includes an A-DAD-A non-fullerene organic material based on the fused ring of DAD structure with benzothiadiazole as a core.

Wherein, the first electron acceptor includes Y6.

Wherein, the first electron acceptor includes DTSC-4F.

Wherein, the second electron acceptor includes PCBM ([6,6]-phenyl-C61-butyric acid methyl ester).

Wherein, the weight percentage of the second electron acceptor in the organic semiconductor mixed material is not more than 15%.

Another category of the present invention is to provide an organic photoelectric device comprises a first electrode including a transparent electrode, a first carrier transfer layer, an active layer which at least comprises the aforementioned organic semiconductor mixed material, a second carrier transfer layer and a second electrode. Wherein, the first carrier transfer layer is disposed between the first carrier transfer layer and the second carrier transfer layer, and the second carrier transfer layer is disposed between the active layer and the second electrode.

Wherein, the first electron acceptor of the organic semiconductor mixed material includes at least one of IT-4F, Y6 and DTSC-4F.

Wherein, the second electron acceptor of the organic semiconductor mixed material includes PCBM.

Compared with the prior art, the organic semiconductor mixed material of the present invention can effectively improve the power conversion efficiency and fill factor of the organic photoelectric device.

BRIEF DESCRIPTION OF THE APPENDED DRAWINGS

Some of the embodiments will be described in detail, with reference to the following figures, wherein like designations denote like members, wherein.

Figure 1:
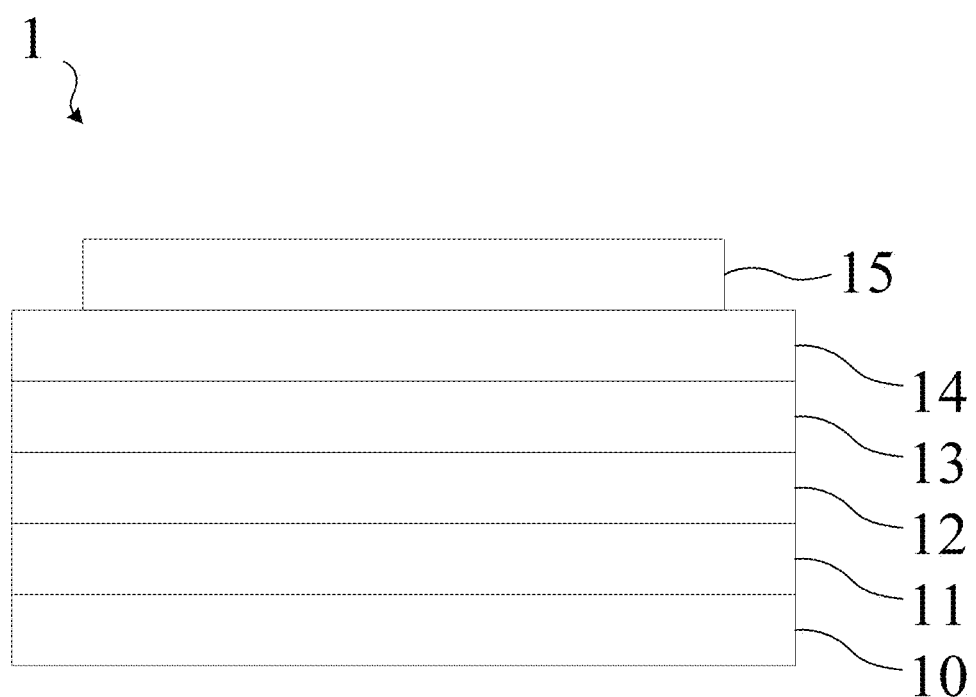
FIG. 1 shows a schematic structural diagram of one embodiment of an organic photoelectric device of the present invention.

The advantages, spirits, and features of the present invention will be explained and discussed with embodiments and figures as follows.

DETAILED DESCRIPTION OF THE INVENTION

In order to make the advantages, spirit and features of the present invention easier and clearer, it will be detailed and discussed in the following with reference to the embodiments and the accompanying drawings. It is worth noting that the specific embodiments are merely representatives of the embodiments of the present invention, but it can be implemented in many different forms and is not limited to the embodiments described in this specification. Rather, these embodiments are provided so that this disclosure will be thorough and complete.

The terminology used in the various embodiments disclosed in the present invention is only for the purpose of describing specific embodiments, and is not intended to limit the various embodiments disclosed in the present invention. As used herein, singular forms also include plural forms unless the context clearly indicates otherwise. Unless otherwise defined, all terms (including technical and scientific terms) used in this specification have the same meanings as commonly understood by one of ordinary skill in the art to which the various embodiments disclosed herein belong. The above terms (such as those defined in commonly used dictionaries) will be interpreted as having the same meaning as the contextual meaning in the same technical field, and will not be interpreted as having an idealized or overly formal meaning, unless explicitly defined in the various embodiments disclosed herein.

In the description of this specification, the description of the reference terms "an embodiment", "a specific embodiment" and the like means that specific features, structures, materials, or characteristics described in connection with the embodiment are included in at least one embodiment of the present invention. In this specification, the schematic expressions of the above terms do not necessarily refer to the same embodiment. Furthermore, the particular features, structures, materials, or characteristics described may be combined in any suitable manner in any one or more embodiments.

Definition

As used herein, "donor" material refers to a semiconductor material, such as an organic semiconductor material, having electron holes as a primary current or charge carrier. In some embodiments, when a p-type semiconductor material is deposited on a substrate, it can provide the electron holes with a hole mobility greater than about 10-5 cm2/Vs. In the case of field effect devices, current on/off ratio of the p-type semiconductor material exhibits more than about 10.

As used herein, "acceptor" material refers to the semiconductor material, such as the organic semiconductor material, having electrons as the primary current or the charge carrier. In some embodiments, when a n-type semiconductor material is deposited on a substrate, it can provide the electrons with an electron mobility greater than about 10-5 cm2/Vs. In the case of field effect devices, current on/off ratio of the n-type semiconductor material exhibits more than about 10.

As used herein, "mobility" refers to a speed rate of the charge carrier moving through the material under the influence of an electric field. The charge carrier is the electron hole (positive charge) in the p-type semiconductor material and the electron (negative charge) in the n-type semiconductor material. This parameter depends on architecture of component and can be measured by field effect component or space charge limiting current.

The compound as used herein is considered as "environmentally stable" or "stabilized under ambient conditions" and refers to that the carrier mobility of the transistor of the semiconductor material utilized the compound is maintained at initial value while the transistor has been exposed to an environmental condition such as air, environmental temperature and humidity for a duration. For example, a compound may be considered to be environmentally stable if the change in carrier mobility of a transistor incorporating the compound is less than 20% or 10% of the initial value after being exposed to the environmental conditions including air, humidity and temperature for 3, 5 or 10 days.

Fill factor (FF) used herein refers to the ratio of the actual maximum available power ($P_m$ or $V_{mp}*J_{mp}$) to the theoretical (non-actually available) power ($J_{sc}*V_{oc}$). Therefore, the fill factor can be determined by the following formula:

$$FF=(V_{mp}*J_{mp})/(V_{oc}*J_{sc})$$

Wherein, the $J_{mp}$ and $V_{mp}$ respectively represent the current density and voltage at the maximum power point ($P_m$), which is obtained by varying the resistance in the circuit to the maximum value of J*V. $J_{sc}$ and $V_{oc}$ represent open circuit current and open circuit voltage, respectively. The fill factor is a key parameter for evaluating solar cells. The fill factor of commercial solar cells is typically greater than about 0.60%.

third component for complementary absorbing spectrum. Please refer to Table 1. Table 1 is the performance test results of the existing organic photoelectric device.

TABLE 1

The organic photoelectric device (PDBT-T1:PCBM:ITIC-Th)

| Addition amount of ITIC-Th (%) | $V_{OC}$ (V) | $J_{SC}$ (mA/cm$^2$) | FF (%) | PCE$^{ave}$ (%) | PCE$_{max}$ (%) |
|---|---|---|---|---|---|
| 0   | 0.915 ± 0.005 | 13.24 ± 0.10 | 76.2 ± 0.5 | 9.23 ± 0.10  | 9.29 |
| 10  | 0.920 ± 0.004 | 14.39 ± 0.14 | 72.8 ± 0.6 | 9.64 ± 0.11  | 9.68 |
| 30  | 0.928 ± 0.005 | 15.06 ± 0.16 | 71.1 ± 0.1 | 9.93 ± 0.11  | 9.99 |
| 50  | 0.934 ± 0.005 | 15.54 ± 0.18 | 70.5 ± 0.6 | 10.22 ± 0.11 | 10.48 |
| 70  | 0.939 ± 0.005 | 14.58 ± 0.15 | 66.8 ± 0.6 | 9.14 ± 0.10  | 9.22 |
| 90  | 0.945 ± 0.005 | 13.27 ± 0.10 | 66.2 ± 0.8 | 8.32 ± 0.13  | 8.48 |
| 100 | 0.950 ± 0.004 | 12.58 ± 0.13 | 59.0 ± 0.8 | 7.05 ± 0.13  | 7.15 |

The open circuit voltage ($V_{oc}$) used herein is the potential difference between the anode and the cathode of the component without connecting the external load.

The power conversion efficiency (PCE) of solar cells used herein refers to the conversion percentage of power from the incident light to the electricity power. The power conversion efficiency (PCE) of solar cells can be calculated by dividing the maximum power point ($P_m$) by the incident light irradiance (E; W/m$^2$) under the standard test conditions (STC) and the surface area (Ac; m$^2$) of the solar cells. STC generally refers to the conditions of temperature of 25° C., irradiance of 1000 W/m$^2$, and air mass (AM) 1.5 spectrum.

The member (e.g., a thin film layer) as used herein can be considered as "photoactive" if it contains one or more compounds capable of absorbing photons to generate excitons for producing photocurrents.

As used herein, "solution proceeding" refers to a process in which a compound (e.g., a polymer), material, or composition can be used in a solution state, such as spin coating, printing (e.g., inkjet printing, gravure printing, and lithography printing), spray coating, slit coating, drop casting, dip coating, and knife coating.

As used herein, "annealing" refers to a post-deposition heat treatment to a semi-crystalline polymer film for certain duration in the environment or under decompressed or pressurized environment. "Annealing temperature" refers to the temperature at which the polymer film or the mixed film of the polymer and other molecules can perform small-scale molecular movement and rearrangement during the annealing process. Without limitation by any particular theory, it is believed that annealing can lead to an increase in crystallinity in the polymer film, enhance the material carrier mobility of the polymer film or a mixed film of the polymer with other molecules, and the molecules are arranged alternately to achieve the effect of independent transmission paths of effective electrons and holes.

In the existing organic photoelectric device, the organic semiconductor mixed material used in the active layer can be mixed with PDBT-T1 (Poly[[5,10-bis(5-octyl-2-thienyl) dithieno[2,3-d:2',3'-d']benzo[1,2-b:4,5-b']dithiophene-2,7-diyl]-2,5-thiophenediyl[5,7-bis(2-ethylhexyl)-4,8-dioxo-4H,8H-benzo[1,2-c:4,5-C]dithiophene-1,3-diyl]-2,5-thiophenediyl]) PCBM ([6,6]-phenyl-C61-butyric acid methyl ester), and ITIC-Th (3,9-bis(2-methylene-(3-(1,1-dicyanomethylene)-indanone))-5,5,11,11-tetrakis(5-hexylthienyl)-dithieno[2,3-d: 2',3'-d']-s-indaceno[1,2-b:5,6-b] dithiophene). Among them, ITIC-Th is the aforementioned As listed in Table 1, with the addition amount of ITIC-Th being 0% and %. The short-circuit current density (JO of the organic photoelectric device with the addition amount of ITIC-Th being 50% is higher than the short-circuit current density of the organic photoelectric device with the addition amount of ITIC-Th being 0%. In return, it has higher power conversion efficiency. However, the fill factor of the organic photoelectric device with the addition amount of ITIC-Th being 50% is less than the short-circuit current density of the organic photoelectric device with the addition amount of ITIC-Th being 0%. Since the fill factor is a key parameter for evaluating organic photoelectric device, adding ITIC-Th improves the power conversion efficiency, but the actual maximum available power of the organic photoelectric device is reduced.

In order to solve the problems in the prior art, the present invention provides an organic semiconductor mixed material for an active layer, which has good morphology control, and can effectively improve the power conversion efficiency of an organic photoelectric device using the same. In one specific embodiment, the organic semiconductor mixed material comprises at least one electron donor, a first electron acceptor and a second electron acceptor. Wherein, the electron donor is an organic polymer. The first electron acceptor is a crystalline material and the self-molecule stacking distance of the first electron acceptor is less than 4 Å. The second electron acceptor is a crystal destruction material, and the second electron acceptor includes a fullerene derivative.

In practical application, the first electron acceptor of the present invention can be IT-4F (3,9-bis(2-methylene-((3-(1,1-dicyanomethylene)-6,7-difluoro)-indanone))-5,5,11,11-tetrakis(4-hexylphenyl)-dithieno[2,3-d:2',3'-d']-s-indaceno [1,2-b:5,6-b']dithiophene), A-DAD-A non-fullerene organic material based on fused ring of DAD structure with benzothiadiazole as the core, or DTSC-4F (2,2'-((2Z,2'Z)-((12-(heptadecan-9-yl)-4,4,7,7-tetraoctyl-7,12-dihydro-4H-thieno[2',3':4,5]silolo[3,2-b]thieno[2',3':4,5]silolo[2,3-h] carbazole-2,9-diyl)bis(methanylylidene))bis(5,6-difluoro-3-oxo-2,3-dihydro-1H-indene-2,1-diylidene))dimalononitrile. Among them, the A-DAD-A type non-fullerene organic material based on the fused ring of DAD structure with benzothiadiazole as the core may be Y6 (2,2'4(2Z,2'Z)-((12, 13-bis(2-ethylhexyl)-3,9-diundecyl-12,13-dihydro-[1,2,5] thiadiazolo[3,4-e]thieno[2",3":4',5']thieno[2',3':4,5]pyrrolo [3,2-g]thieno[2',3':4,5]thieno[3,2-b]indole-2,10-diyl)bis (methanylylidene))bis(5,6-difluoro-3-oxo-2,3-dihydro-1H- indene-2,1-diylidene))dimalononitrile). The second electron acceptor may be PCBM. Please refer to Table 2. Table 2 shows the self-molecular stacking distance of the first electron acceptor of the present invention.

TABLE 2

| First electron acceptor | Self-molecular stacking distance (d-spacing (Å)) | Wave vector change of Z-axis X-ray before and after scattering ($q_z(\text{Å}^{-1})$) |
|---|---|---|
| IT-4F | 3.89 | 1.61 |
| Y6 | 3.57 | 1.76 |
| DTSC-4F | 3.55 | 1.77 |

Please referring to FIG. 1, FIG. 1 shows a schematic structural diagram of one embodiment of an organic photoelectric device of the present invention. As shown in FIG. 1. In another embodiment, the present invention further provides an organic photoelectric device 1, which comprises a first electrode 11, a second electrode 15 and an active layer 13. The active layer 13, which includes the aforementioned organic semiconductor material, is disposed between the first electrode 11 and the second electrode 15. In practice, the organic photoelectric device 1 may have a laminated structure, which sequentially includes a substrate 10, the first electrode 11 (transparent electrode), an electron transfer layer (ETL) 12, the active layer 13, a hole transfer layer (HTL) 14 and the second electrode 15. In addition, the organic photoelectric device 1 may include an organic photovoltaic device, an organic light sensing device, an organic light emitting diode, and an organic thin film transistor (OTFT).

In practice, the active layer of the organic photoelectric device of the present invention comprises the aforementioned organic semiconductor material including the at least one electron donor, the first electron acceptor and the second electron acceptor.

Preparation of the Active Layer:
Synthesis steps of DTSC-4F.
Synthesis of Compound 2

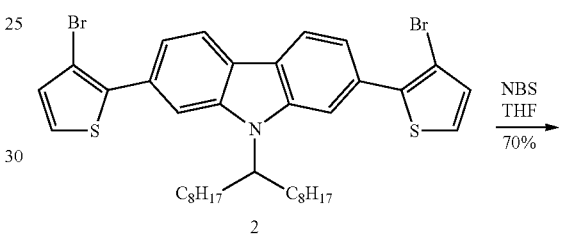

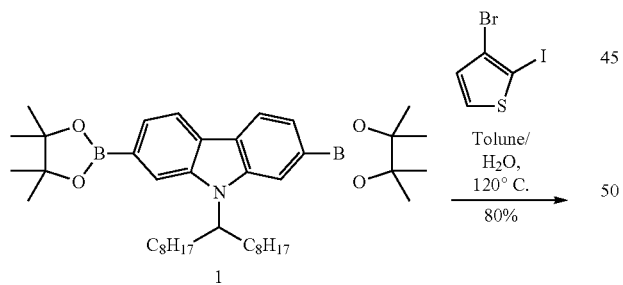

Compound 1 (0.30 g, 0.47 mmol), 3-bromo-2-iodothiophene (0.32 g, 1.11 mmol), $K_2CO_3$ (0.39 g, 2.82 mmol), Aliquant 336 (0.05 g, 0.12 mmol), and $Pd(PPh_3)_4$ (54 mg, 0.047 mmol) were dissolved in deoxygenated toluene/H2O (12 mL, 5:1, v/v). The reaction mixture was refluxed at 120° C. for 72 h and then extracted with diethyl ether (50 mL×3) and water (50 mL). The collected organic layer was dried over $MgSO_4$. After the removal of the solvent under reduced pressure, the residue was purified by the column chromatography on silica gel (hexane/ethyl acetate, v/v, 30/1) to give a pale yellow sticky product 2 (0.30 g, 88%). 1H NMR ($CDCl_3$, 400 MHz, ppm): δ 0.77-0.90 (m, 6H), 1.02-1.25 (m, 24H), 1.89-1.98 (m, 2H), 2.28-2.39 (m, 2H), 4.58-4.64 (m, 1H), 7.11 (d, J=5.4 Hz, 2H), 7.31 (d, J=5.4 Hz, 2H), 7.45 (dd, J 1=8.1 Hz, J 2=1.2 Hz, 2H), 7.76 (br, 1H), 7.97 (br, 1H), 8.11 (br, 2H); 13 C NMR ($CDCl_3$, 75 MHz, ppm): δ 14.20, 22.73, 26.96, 29.30, 29.47, 29.53, 31.89, 33.99, 56.79, 107.43, 109.77, 112. 23, 120.29, 120.42, 120.69, 122.16, 123.54, 125.04, 129.87, 130.45, 131.91, 139.11, 139.54, 142.59, 158.01; MS (FAB, C37H45Br2NS2): calcd, 727.70; found, 728.

Synthesis of Compound 3

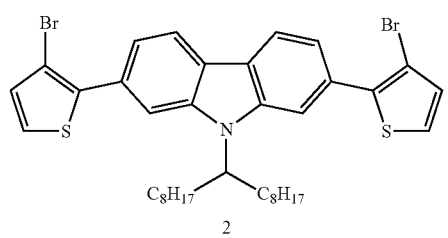

N-Bromosuccimide (0.38 g, 2.12 mmol) was added in one portion to a solution of 2 (0.67 g, 0.92 mmol) in acetone (15 mL). The reaction was stirred under dark for 12 h at room temperature. The mixture solution was extracted with diethyl ether (50 mL×3) and water (50 mL). The combined organic layer was dried over $MgSO_4$. After the removal of the solvent under reduced pressure, the residue was purified by column chromatography on silica gel (hexane) to give a pale yellow sticky product 3 (0.55 g, 68%). 1H NMR ($CDCl_3$, 400 MHz, ppm): δ 0.79-0.90 (m, 6H), 0.95-1.25 (m, 24H), 1.82-1.90 (m, 2H), 2.17-2.28 (m, 2H), 4.44-4.51 (m, 1H), 7.11 (d, J=5.4 Hz, 2H), 7.43 (d, J=5.4 Hz, 2H), 7.46 (br, 1H), 7.62 (br, 1H), 8.35 (d, J=6.9 Hz, 2H); 13C NMR ($CDCl_3$, 75 MHz, ppm): δ 14.21, 15.42, 22.73, 26.77, 29.24, 29.39, 29.41, 31.86, 33.75, 57.17, 65.99, 111.48, 113.59, 114.59, 115.98, 123.23, 124.62, 124.93, 126.27, 130.18, 130.80, 131.35, 138.04, 138.22, 141.55; MS (FAB, C37H43Br4NS2): calcd, 885.49; found, 886.

Synthesis of Compound 4

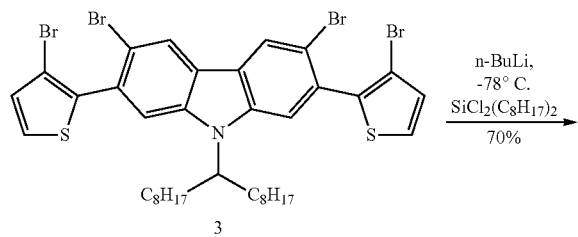

Synthesis of Compound 5

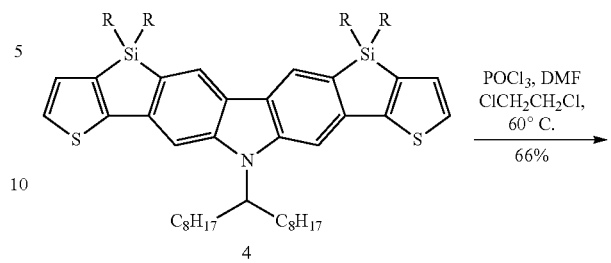

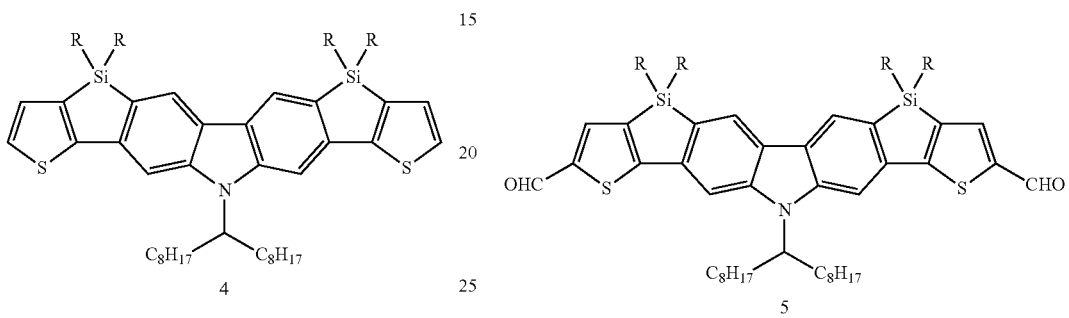

A 2.5 M solution of n-Butyllithium (n-BuLi) in hexane (7.46 mL, 18.65 mmol) was added dropwise to a solution of 3 (3.12 g, 3.52 mmol) in dry THF (82 mL) at −78° C. After stirring at −78° C. for 1 h and room temperature for 1 h, Di-n-octyldichlorosilane (3.53 g, 10.84 mmol) was introduced by syringe to the solution at −78° C. The mixture solution was warmed up to room temperature and stirred for 15 h. The mixture solution was quenched with water and extracted with diethyl ether (50 mL×3) and water (50 mL). The combined organic layer was dried over MgSO4. After the removal of the solvent under reduced pressure, the residue was purified by column chromatography on silica gel (hexane) to give a green sticky product 4 (1.05 g, 27.77%). 1H NMR (CDCl$_3$, 400 MHz, ppm): δ 0.7-0.9 (m, 16H), (m, 82H), 1.95-2.09 (m, 2H), 2.25-2.34 (m, 2H), 4.53-4.68 (m, 1H), 7.12-7.18 (m, 1H), 7.28-7.32 (m, 1H) 7.41-7.48 (s, 1H), 7.58-7.64 (s, 1H), 8.15-8.21 (s, 2H); MS (FAB, C69H111NS2Si2): calcd, 1073.7; found, 1073.8.

A mixture of compound 4 (320 mg, 0.29 mmol) and 1,2-dichloroethane (20 mL) was deoxygenated with nitrogen for 30 mins and then added a solution of POCl$_3$ (0.13 mL) in DMF (1.36 mL) at 0° C. After being stirred at 60° C. for 20 hours, the mixture was poured into Na$_2$CO$_3$(aq) and extracted with CH$_2$Cl$_2$. The organic layer was washed with water, and then dried over anhydrous MgSO$_4$. After the removal of solvent, the residue was purified by column chromatography on silica gel using n-hexane/CH2Cl2 (1:1) as eluent to give product 5 as a yellow solid (240 mg, 73%). 1H NMR (CDCl$_3$, 400 MHz, ppm): δ 0.7-0.9 (m, 16H), 0.94-1.5 (m, 82H), 1.95-2.09 (m, 2H), 2.25-2.34 (m, 2H), 4.53-4.68 (m, 1H), 7.56-7.61 (s, 1H), 7.73-7.77 (s, 1H), 7.79-7.83 (s, 2H), 8.20-8.30 (d, J=8 Hz, 2H), 9.91-9.96 (s, 2H).

Synthesis of DTSC-4F:

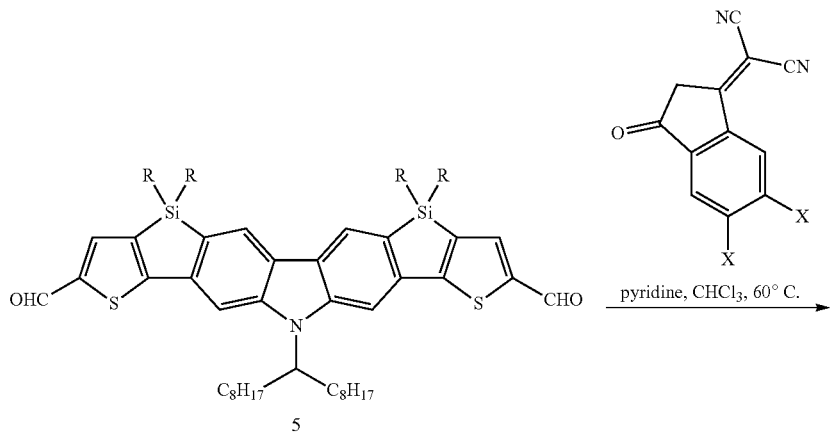

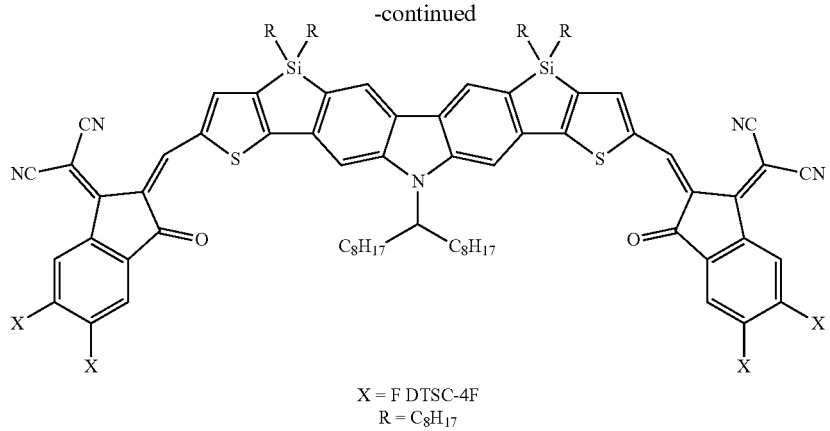

X = F DTSC-4F
R = C8H17

A mixture of compound 5 (240 mg, 0.21 mmol), 2-(5,6-difluoro-3-oxo-2,3-dihydro-1H-inden-1-ylidene) malononitrile (240 mg, 1.05 mmol) in CHCl$_3$ (15.5 mL) was deoxygenated with nitrogen for 30 minutes. Pyridine (0.3 mL) was added and refluxed for 24 hours. After the mixture was cooled to room temperature, the mixture was poured into water (100 mL) and extracted with CH$_2$Cl$_2$. The organic layer was washed with water, and then dried over anhydrous MgSO$_4$. After the removal of solvent, the residue was purified by column chromatography on silica gel using n-hexane/CH$_2$Cl$_2$ (1:1) as eluent to give DTSC-4F as a dark blue solid (190 mg, 58%). 1H NMR (CDCl$_3$, 400 MHz, ppm): δ 0.72-0.87 (m, 16H), 0.97-1.50 (m, 82H), 2.05-2.16 (m, 2H), 2.28-2.43 (m, 2H), 4.64-4.72 (m, 1H), 7.68-7.77 (q, J=8 Hz), 7.82-7.86 (s, 1H), 7.91-7.97 (m, 3H), 8.27-8.30 (s, 1H), 8.31-8.34 (s, 1H), 8.54-8.61 (m, 2H), 8.99-9.03 (s, 2H); MS (FAB, C95H115F4N5O2S2Si2): calcd, 1553.8; found, 1554.7. Through the above steps, DTSC-4F can be prepared.

The active layer of the specific embodiment of FIG. 1 can include the electron donor, the first electron acceptor, and the second electron acceptor. Among them, the electron donor includes a structure as shown in the following formula I:

substituents, C1-C30 benzene fused heterocyclic compounds with and without substituents, C1-C30 fused heterocyclic compounds with and without substituents, benzene rings with and without substituents, five-membered heterocycles with and without substituents, and six-membered heterocycles with and without substituents; π can be selected from one of the following groups: C1~C30 fused ring aromatic hydrocarbons with and without substituents, C1-C30 benzene fused heterocyclic compounds with and without substituents, C1-C30 fused heterocyclic compounds with and without substituents, benzene rings with and without substituents, five-membered heterocycles with and without substituents, six-membered heterocycles with and without substituents, alkenes and alkynes with and without substituents; m, m', a, n, n' and b can be the same or different, and m, m', a, n, n' and b are integers selected from 0 to 5; and the sum of x and y is 1. Further, in the structure of formula I of the electron donor, at least one of Ar and Ar' further includes at least one of the hetero atoms Si and S. The substituent in the structure of formula 5 is selected from one of the following groups: C1-C30 alkyl, C1-C30 branched alkyl, C1-C30 silyl, C1-C30 ester, C1-C30 alkoxy, C1-C30 alkylthio, C1-C30 haloalkyl, C1-C30 olefin,

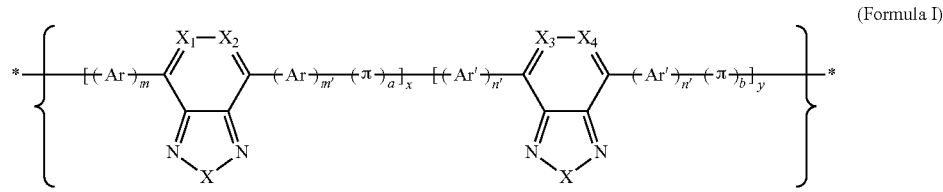

(Formula I)

Wherein, X is selected from one of C, S, N and O; X$_1$ to X$_4$ can be the same or different, and X$_1$ to X$_4$ are selected from one of C, C—F, C—Cl, C—Br and C—I, respectively. Ar and Ar' can be the same or different, and Ar and Ar' are respectively selected from one of the following groups: C1~C30 fused ring aromatic hydrocarbons with and without C1-C30 alkyne, C1-C30 cyano-containing carbon chain, C1-C30 nitro-containing carbon chain, C1-C30 hydroxy-containing carbon chain, C1-C30 keto-containing carbon chain, oxygen and halogen. In practical applications, the electron donor is selected from one of the following structures:

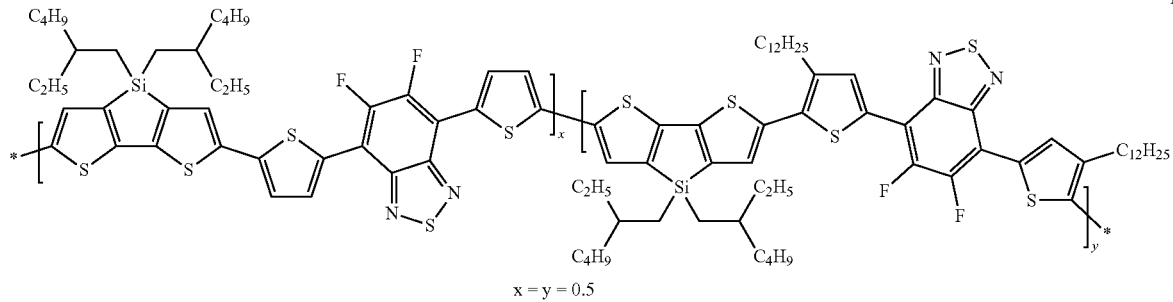
D-1
x = y = 0.5
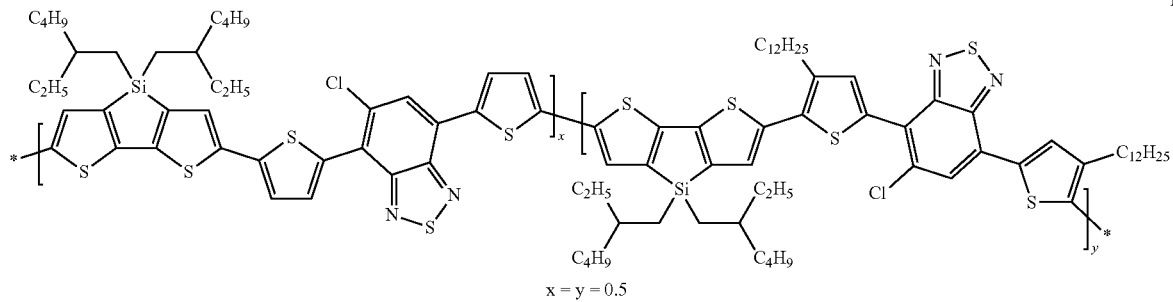
D-2
x = y = 0.5
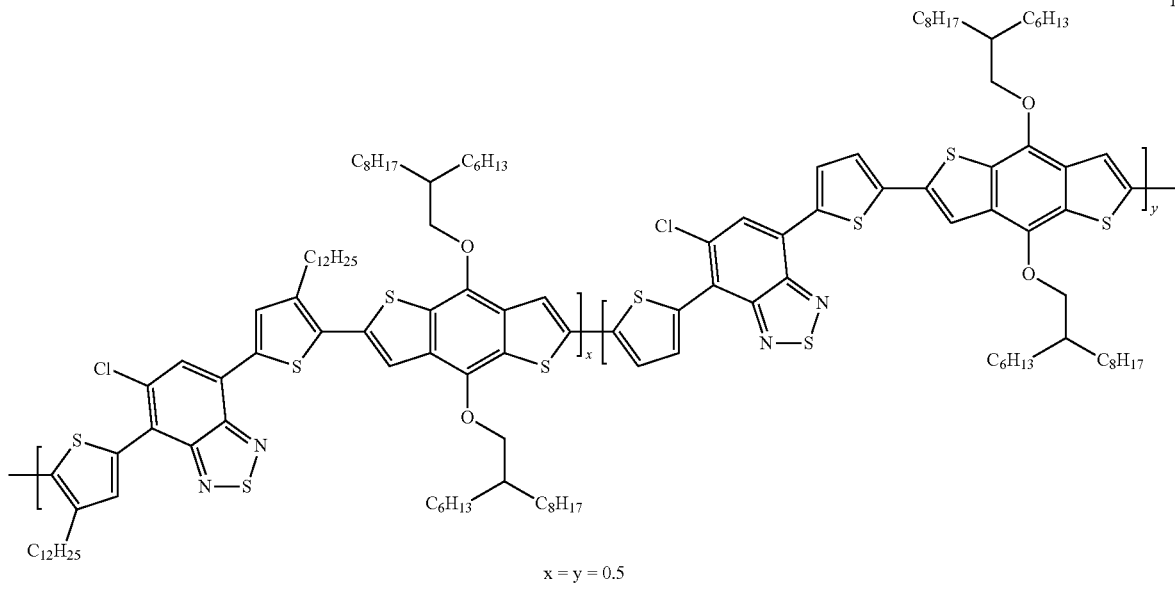
D-3
x = y = 0.5
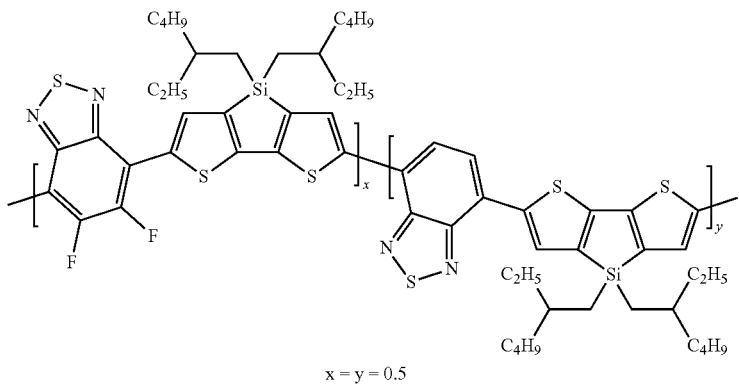
D-4
x = y = 0.5

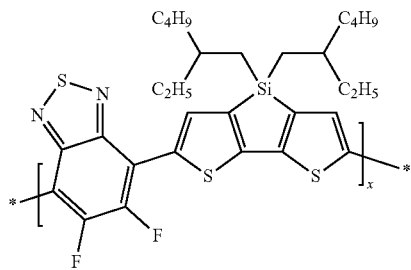

D-5

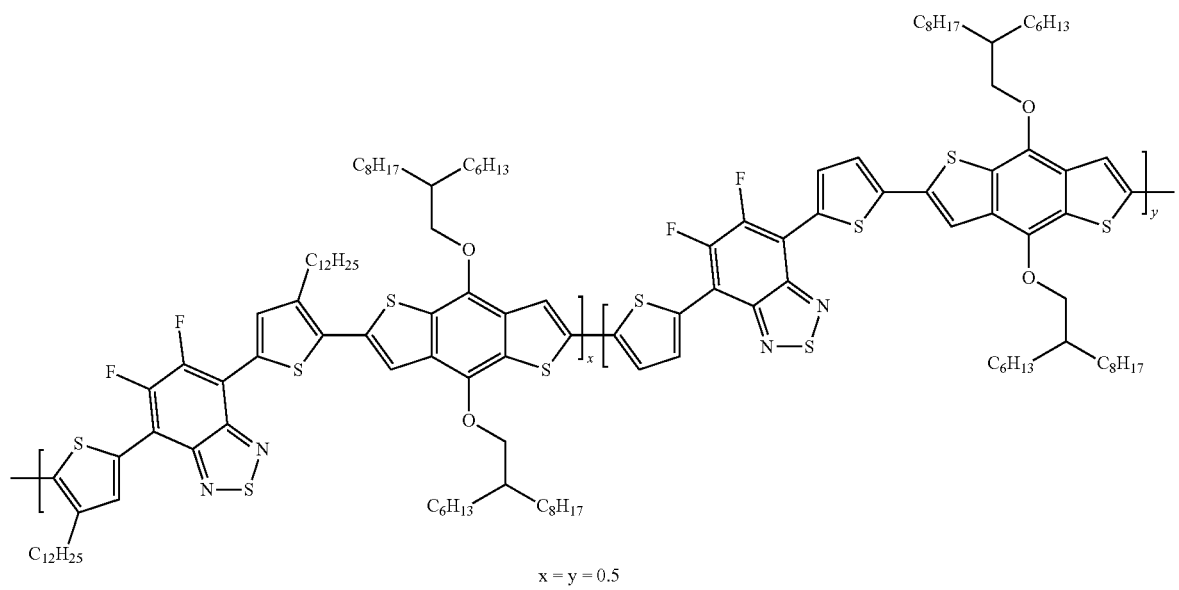

D-6 x = y = 0.5

The first electron acceptor can be one of the aforementioned IT-4F, Y6, and DTSC-4F. The second electron acceptor can be PCBM. In the following, by testing the organic photoelectric device 1 (the structure of which is shown in FIG. 1) using the aforementioned active layer, the effectiveness of the organic semiconductor mixed material of the present invention applied in the organic photoelectric device is obtained.

Preparation and Testing of the Organic Photoelectric Devices:

A glass coated by a pre-patterned Indium Tin Oxides (ITO) with a sheet resistance of ~15 Ω/sq is used as a substrate. The substrate is ultrasonically oscillated in soap deionized water, deionized water, acetone, and isopropanol in sequence, and washed in each step for 15 minutes. The washed substrate is further treated with a UV-ozone cleaner for 30 minutes. A top coating layer of ZnO (diethylzinc solution, 15 wt % in toluene, diluted with tetrahydrofuran) is spin coated on the ITO substrate with a rotation rate of 5000 rpm for 30 seconds, and then baked at 150° C. in air for 20 minutes. The active layer solution was prepared in o-xylene. The active layer includes the aforementioned organic semiconductor material. To completely dissolve the active layer material, the active layer solution is stirred on a hot plate at 120° C. for at least 1 hour. Then, the active layer material is returned to the room temperature for spin coating. Finally, the thin film formed by the coated active layer (D1:IT-4F(:PCBM)) is annealed at 120° C. for 5 minutes, the thin film formed by the coated active layer (D2:Y6(:PCBM)) is annealed at 100° C. for 10 minutes, the thin film formed by the coated active layer (D3:DTSC-4F(:PCBM)) is annealed at 110° C. for 10 minutes, and then transferred to a thermal evaporation machine. A thin layer (8 nm) of $MoO_3$ is deposited as an anode intermediate layer under a vacuum of $3\times10^{-6}$ Torr, and then a silver layer with a thickness of 100 nm is deposited as an upper electrode. All batteries are encapsulated with epoxy resin in the glove box to make organic electronic components (ITO/ETL/active layer/$MoO_3$/Ag). The J-V characteristics of the components is measured by a solar simulator (having a xenon lamp with an AM 1.5G filter) in air and at room temperature and under AM 1.5 G (100 mW $cm^{-2}$).

Efficiency Analysis of the Organic Photoelectric Devices:

In one example, the active layer of the organic photoelectric device of the present invention uses IT-4F (structure is as follows) as the first electron acceptor and uses PCBM as the second electron acceptor.

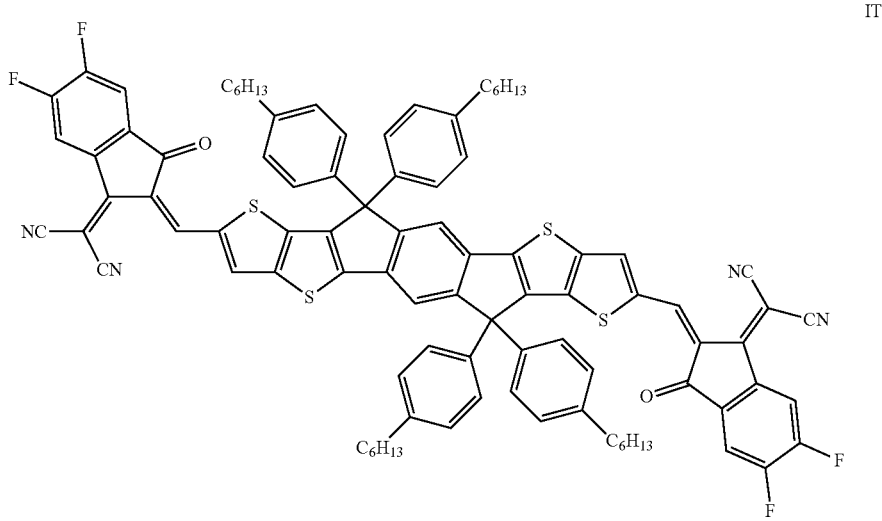

IT-4F

The active layer also contains the additive 1,8-diiodooctane (D10). In order to understand and confirm the effect of the addition ratio of each component on the performance of the organic photoelectric device (D1:IT-4F(:PCBM)) and the optimal addition ratio. Please refer to Table 3, Table 3 shows the results of the performance test of the organic photoelectric device at different addition ratios.

TABLE 3

The organic photoelectric device (D1:IT-4F(:PCBM))

| D:A1:A2 | $V_{OC}$ (V) | $J_{SC}$ (mA/cm$^2$) | FF (%) | PCE$_{max}$ (%) | PCE$_{ave}$ (%) |
|---|---|---|---|---|---|
| 1:1:0 | 0.91 | 21.8 | 71.8 | 14.3 | 13.9 |
| 1:1:0.1 | 0.92 | 21.8 | 70.1 | 14.1 | 13.8 |
| 1:0.9:0.1 | 0.92 | 21.7 | 71.1 | 14.3 | 13.9 |

As shown in Table 3, the organic photoelectric device (D1:IT-4F (:PCBM)) has better performance when the addition ratio is D1:IT-4F:PCBM=1:0.9:0.1, and fill factor and power conversion efficiency are both improved simultaneously. Therefore, the organic photoelectric device with this addition ratio is subjected to UV absorption tests and morphology tests.

Figure 2:
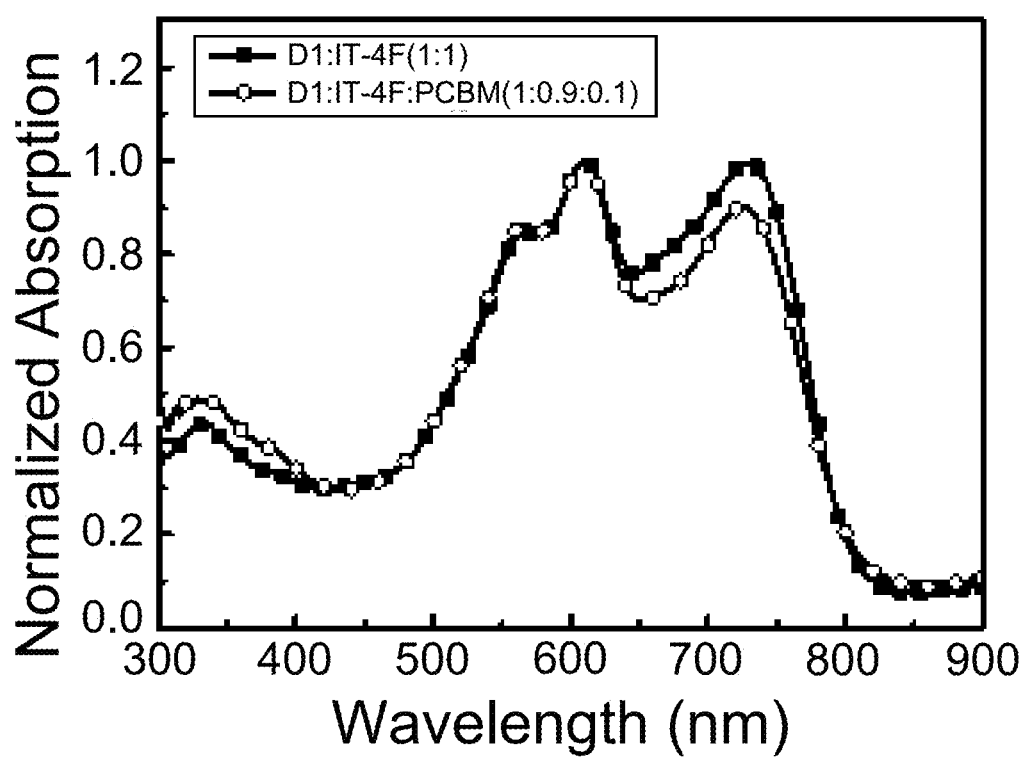
FIG. 2 shows the UV absorption test result of one embodiment of the organic photoelectric device of the present invention.
Figure 3A:
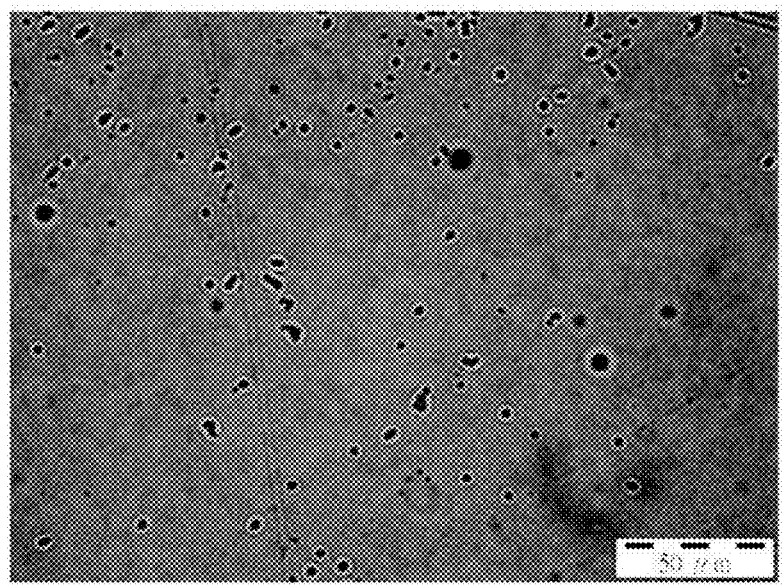
FIG. 3A shows the morphology test result of one embodiment of the organic photoelectric device without adding PCBM.
Figure 3B:
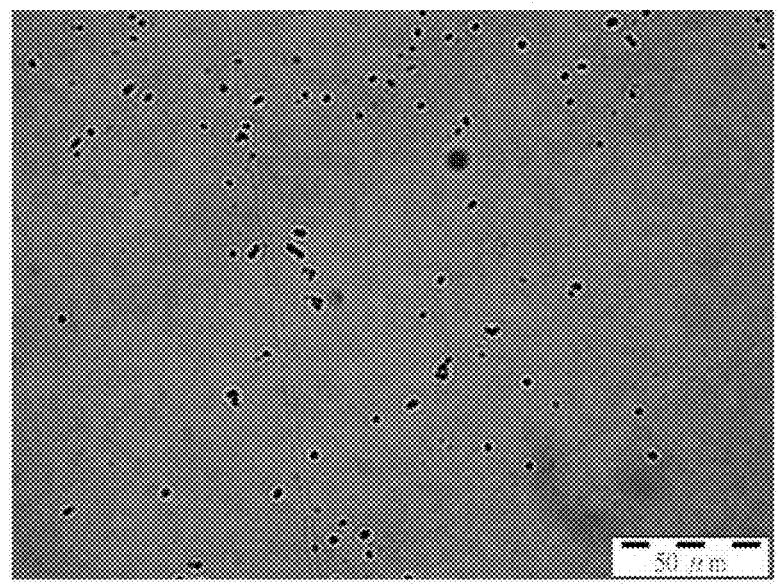
FIG. 3B shows the morphology test result of one embodiment of the organic photoelectric device of the present invention.

Please refer to FIG. 2, FIG. 3A and FIG. 3B. FIG. 2 shows the UV absorption test result of one embodiment of the organic photoelectric device of the present invention, FIG. 3A shows the morphology test result of one embodiment of the organic photoelectric device without adding PCBM, and FIG. 3B shows the morphology test result of one embodiment of the organic photoelectric device of the present invention. As shown in FIG. 2, combining Table 3 with FIG. 2 shows that there is no significant change in the absorption band and short-circuit current density (JO before and after the addition of PCBM. However, the addition of PCBM can improve the power conversion efficiency (PCE) and fill factor (FF). It can be seen that the organic photoelectric device (D1:IT-4F(:PCBM)) of the present invention is different from the purpose of the prior art. The purpose of the prior art is broadening the spectral absorption of the organic photoelectric device and improve the short-circuit current density (JO. Receptor, the purpose of the present invention is not to change the absorption band of the organic photoelectric device, but to improve the morphology of the active layer. Thereby, the power conversion efficiency (PCE) and fill factor (FF) are improved. As shown in FIGS. 3A and 3B, it can be clearly seen that the aggregation state of the organic semiconductor mixed material (D1:IT-4F:PCBM) in FIG. 3B is significantly less than the aggregation state of the organic semiconductor mixed material (D1:IT-4F) in FIG. 3A. Therefore, the organic semiconductor mixed material (D1:IT-4F:PCBM) effectively controls its morphology.

In another example, the active layer of the organic photoelectric device of the present invention uses Y6 (structure is as follows) as the first electron acceptor and uses PCBM as the second electron acceptor.

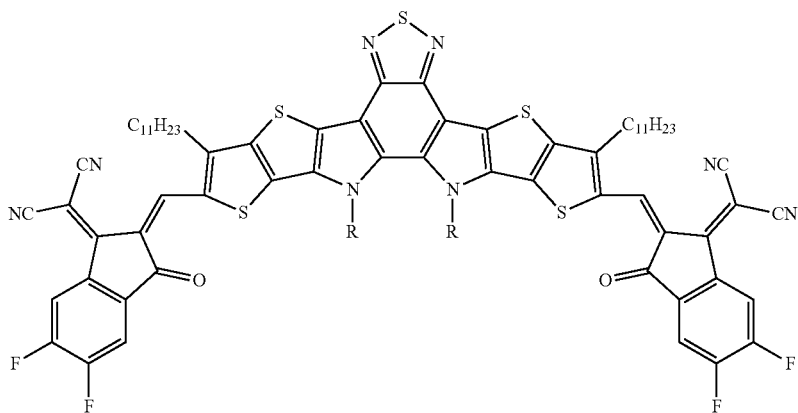

Y6

The active layer also contains the additive 1-choronaphthalene (CN). In order to understand and confirm the effect of the addition ratio of each component on the performance of the organic photoelectric device (D2:Y6(:PCBM)) and the optimal addition ratio. Please refer to Table 4, Table 4 shows the results of the performance test of the organic photoelectric device at different addition ratios.

TABLE 4

| The organic photoelectric device (D2:Y6(:PCBM)) | | | | | |
|---|---|---|---|---|---|
| D:A1:A2 | $V_{OC}$ (V) | $J_{SC}$ (mA/cm$^2$) | FF (%) | PCE$_{max}$ (%) | PCE$_{ave}$ (%) |
| 1:1.2:0 | 0.86 | 24.6 | 72.1 | 15.2 | 14.9 |
| 1:1.1:0.1 | 0.86 | 25.5 | 73.7 | 16.2 | 15.9 |
| 1:1:0.2 | 0.86 | 25.8 | 73.3 | 16.3 | 15.8 |
| 1:0.9:0.3 | 0.86 | 25.8 | 72.8 | 16.1 | 15.8 |
| 1:0.8:0.4 | 0.87 | 25.3 | 69.7 | 15.3 | 14.7 |

As shown in Table 4, the organic photoelectric device (D2:Y6 (:PCBM)) has better performance when the addition ratio is D2:Y6:PCBM=1:1:0.2, and fill factor and power conversion efficiency are both improved simultaneously. Therefore, the organic photoelectric device with this addition ratio is subjected to UV absorption tests and morphology tests.

Figure 4:
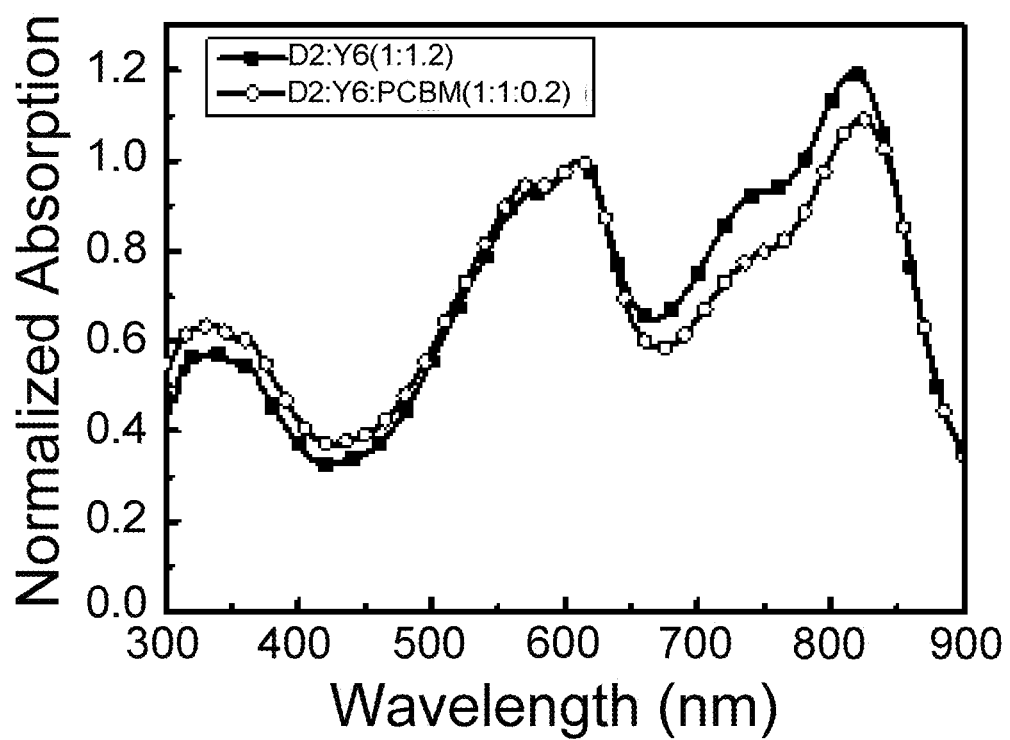
FIG. 4 shows the UV absorption test result of another embodiment of the organic photoelectric device of the present invention.
Figure 5A:
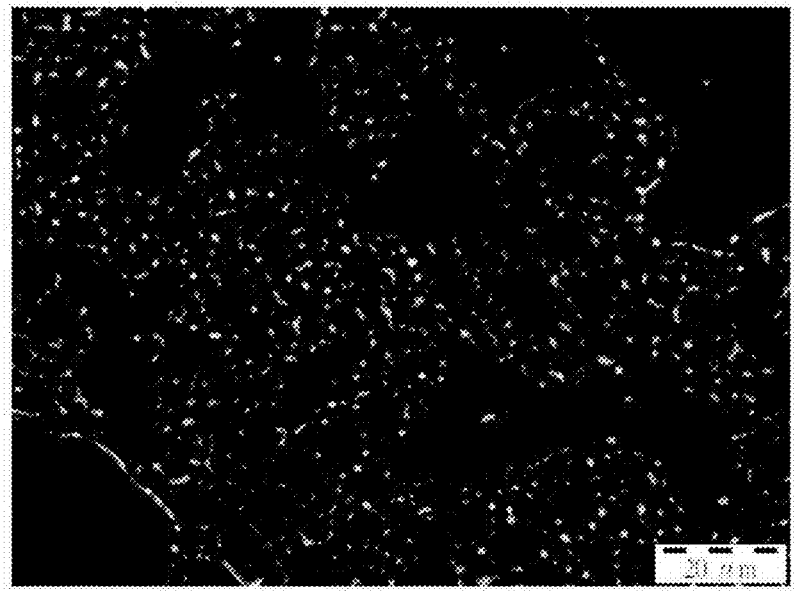
FIG. 5A shows the morphology test result of another embodiment of the organic photoelectric device without adding PCBM.
Figure 5B:
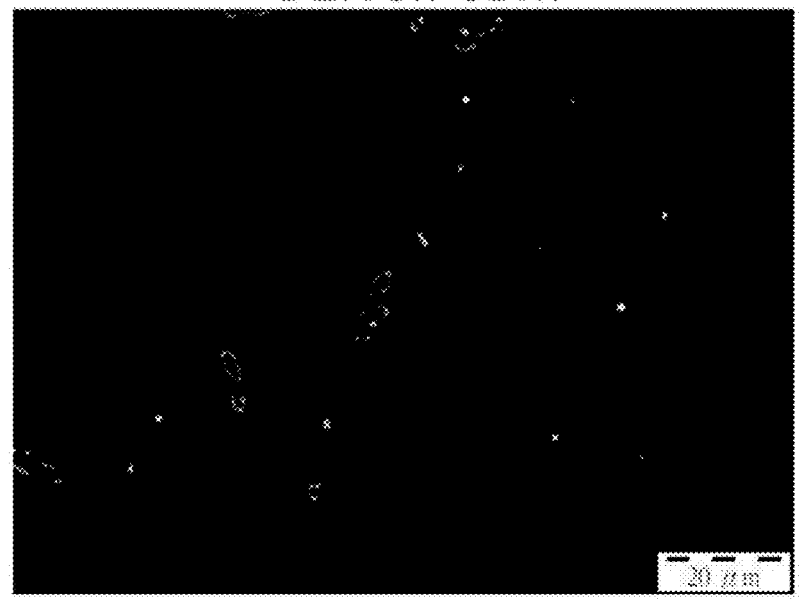
FIG. 5B shows the morphology test result of another embodiment of the organic photoelectric device of the present invention.

Please refer to FIG. 4, FIG. 5A and FIG. 5B. FIG. 4 shows the UV absorption test result of another embodiment of the organic photoelectric device of the present invention, FIG. 5A shows the morphology test result of another embodiment of the organic photoelectric device without adding PCBM, and FIG. 5B shows the morphology test result of another embodiment of the organic photoelectric device of the present invention. As shown in FIG. 4, combining Table 4 with FIG. 4 shows that there is no significant change in the absorption band and short-circuit current density ($J_{sc}$) before and after the addition of PCBM. However, the addition of PCBM can improve the power conversion efficiency (PCE) and fill factor (FF). It can be seen that the organic photoelectric device (D2:Y6(:PCBM)) of the present invention is different from the purpose of the prior art. The purpose of the prior art is to broaden the spectral absorption of the organic photoelectric device and improve the short-circuit current density ($J_{sc}$). Moreover, the purpose of the present invention is not to change the absorption band of the organic photoelectric device, but to improve the morphology of the active layer. Thereby, the power conversion efficiency (PCE) and fill factor (FF) are improved. As shown in FIGS. 5A and 5B, it can be clearly seen that the aggregation state of the organic semiconductor mixed material (D2:Y6:PCBM) in FIG. 5B is significantly less than the aggregation state of the organic semiconductor mixed material (D2:Y6) in FIG. 5A. Therefore, the organic semiconductor mixed material (D2:Y6:PCBM) effectively controls its morphology.

In more another example, the active layer of the organic photoelectricdevice of the present invention uses DTSC-4F (structure is as follows) as the first electron acceptor and uses PCBM as the second electron acceptor.

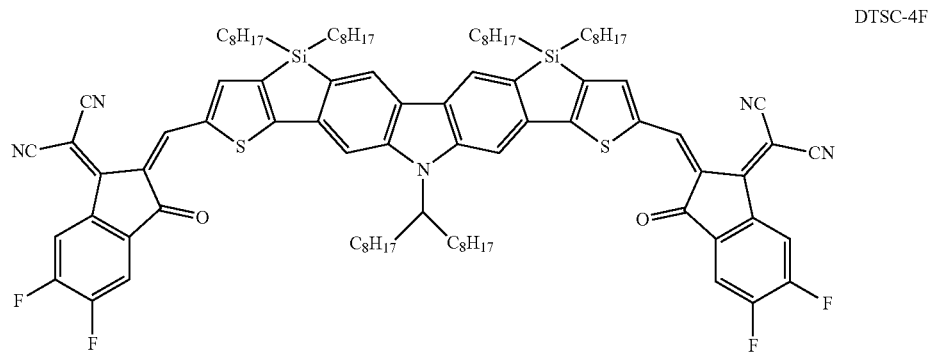

DTSC-4F

In order to understand and confirm the effect of the addition ratio of each component on the performance of the organic photoelectric device (D3:DTSC-4F(:PCBM)) and the optimal addition ratio. Please refer to Table 5, Table 5 shows the results of the performance test of the organic photoelectric device at different addition ratios.

TABLE 5

The organic photoelectric device (D3:DTSC-4F(:PCBM))

| D:A1:A2 | $V_{OC}$ (V) | $J_{SC}$ (mA/cm$^2$) | FF (%) | PCE$_{max}$ (%) | PCE$_{ave}$ (%) |
|---|---|---|---|---|---|
| 1:1:0 | 0.99 | 17.0 | 64.8 | 11.0 | 10.8 |
| 1:0.8:0.2 | 0.99 | 17.0 | 68.8 | 11.6 | 11.4 |
| 1:1:0.2 | 0.99 | 17.8 | 64.9 | 11.5 | 11.3 |

Figure 6:
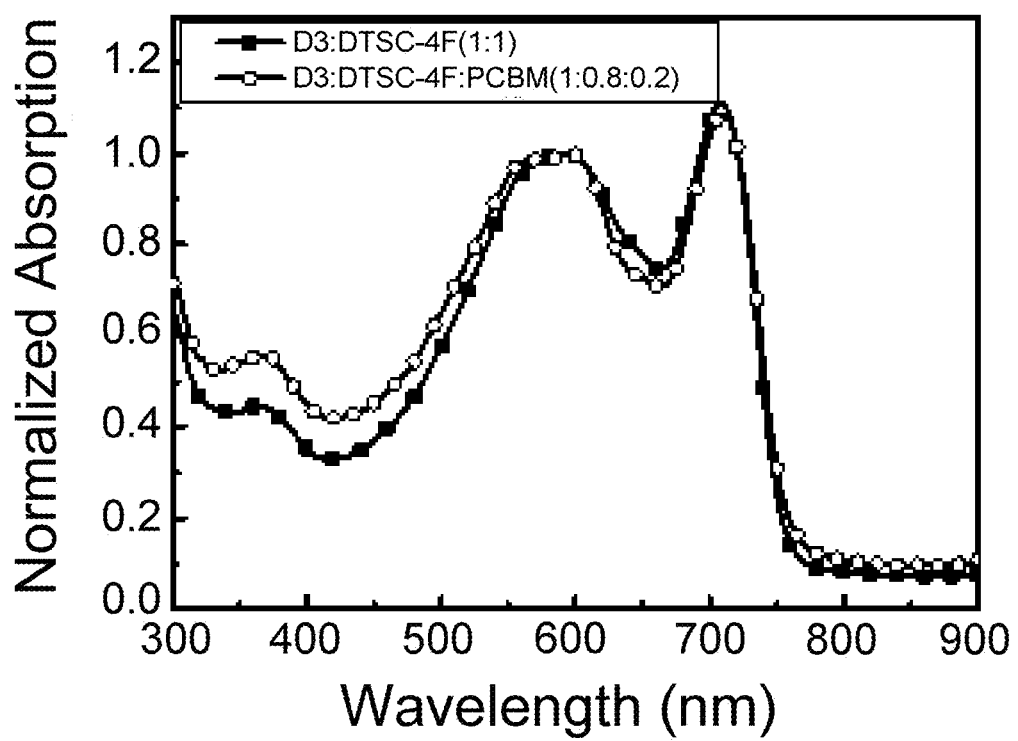
FIG. 6 shows the UV absorption test result of more another embodiment of the organic photoelectric device of the present invention.
Figure 7A:
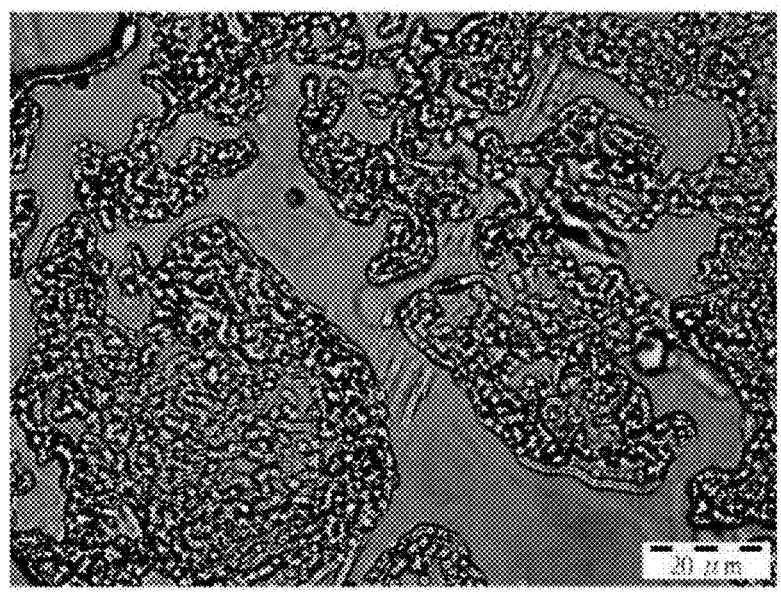
FIG. 7A shows the morphology test result of more another embodiment of the organic photoelectric device without adding PCBM.
Figure 7B:
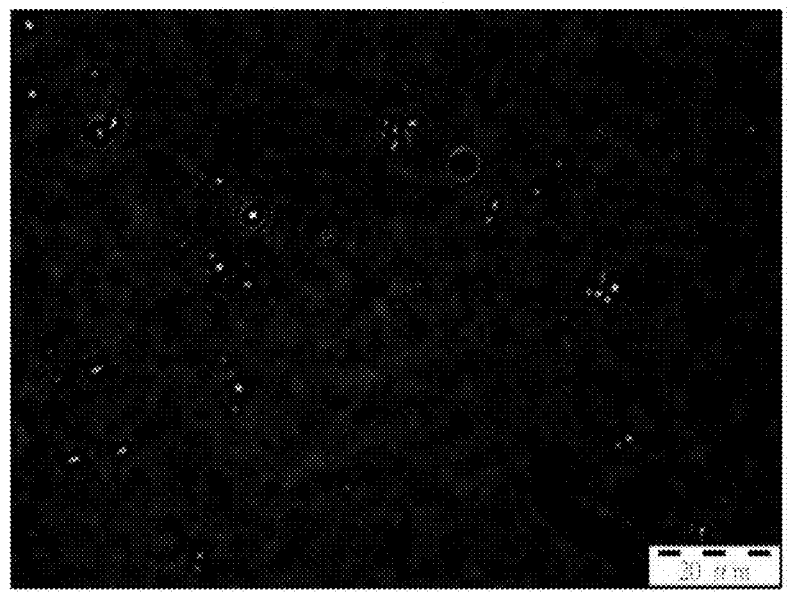
FIG. 7B shows the morphology test result of more another embodiment of the organic photoelectric device of the present invention.

As shown in Table 5, the organic photoelectric device (D3:DTSC-4F (:PCBM)) has better performance when the addition ratio is D3:DTSC-4F:PCBM=1:0.8:0.2, and fill factor and power conversion efficiency are both improved simultaneously. Therefore, the organic photoelectric device with this addition ratio is subjected to UV absorption tests and morphology tests. Please refer to FIG. 6, FIG. 7A and FIG. 7B. FIG. 6 shows the UV absorption test result of another embodiment of the organic photoelectric device of the present invention, FIG. 7A shows the morphology test result of another embodiment of the organic photoelectric device without adding PCBM, and FIG. 7B shows the morphology test result of another embodiment of the organic photoelectric device of the present invention. As shown in FIG. 6, combining Table 5 with FIG. 6 shows that there is no significant change in the absorption band and short-circuit current density ($J_{sc}$) before and after the addition of PCBM. However, the addition of PCBM can improve the power conversion efficiency (PCE) and fill factor (FF). It can be seen that the organic photoelectric device (D3:DTSC-4F (:PCBM)) of the present invention is different from the purpose of the prior art. The purpose of the prior art is to broaden the spectral absorption of the organic photoelectric device and improve the short-circuit current density ($J_{sc}$). Moreover, the purpose of the present invention is not to change the absorption band of the organic photoelectric device, but to improve the morphology of the active layer. Thereby, the power conversion efficiency (PCE) and fill factor (FF) are improved. As shown in FIGS. 7A and 7B, it can be clearly seen that the aggregation state of the organic semiconductor mixed material (D3:DTSC-4F:PCBM) in FIG. 7B is significantly less than the aggregation state of the organic semiconductor mixed material (D3:DTSC-4F) in FIG. 7A. Therefore, the organic semiconductor mixed material (D3:DTSC-4F:PCBM) effectively controls its morphology.

Based on the above experimental results, the weight percentage of the second electron acceptor is not greater than 15%. In addition, the organic photoelectric device of the present invention can effectively control the morphology, and can improve the energy conversion efficiency (PCE)—more than 10% without reducing the fill factor.

With the detailed description of the above embodiments, it is hoped that the features and spirit of the present invention can be more clearly described, and the scoped of the present invention is not limited by the embodiments disclosed above. On the contrary, the intention is to cover various changes and equivalent arrangements within the scope of the patents to be applied for in the present invention.

What is claimed is:

1. An organic semiconductor mixed material comprising:
    at least one electron donor which is an organic polymer, with Formula I:

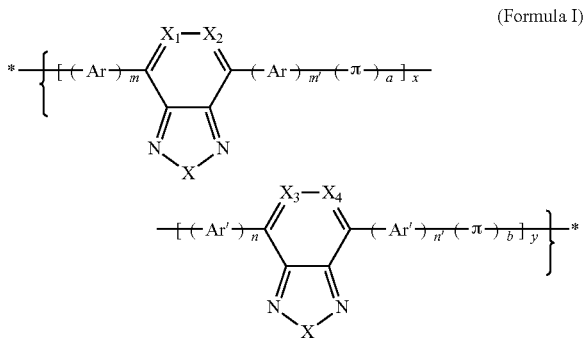

Wherein, X is selected from one of C, S, N and O; $X_1$ to $X_4$ can be the same or different, and $X_1$ to $X_4$ are selected from one of C, C—F, C—Cl, C—Br and C—I, respectively, Ar and Ar' can be the same or different, and Ar and Ar' are respectively selected from one of the following groups: C1~C30 fused ring aromatic hydrocarbons with and without substituents, C1-C30 benzene fused heterocyclic compounds with and without substituents, C1-C30 fused heterocyclic compounds with and without substituents, benzene rings with and without substituents, five-membered heterocycles with and without substituents, and six-membered heterocycles with and without substituents; π can be selected from one of the following groups: C1~C30 fused ring aromatic hydrocarbons with and without substituents, C1-C30 benzene fused heterocyclic compounds with and without substituents, C1-C30 fused heterocyclic compounds with and without substituents, benzene rings with and without substituents, five-membered heterocycles with and without substituents, six-membered heterocycles with and without substituents, alkenes and alkynes with and without substituents; m, m', a, n, n' and b can be the same or different, and m, m', a, n, n' and b are integers selected from 0 to 5; and the sum of x and y is 1, and x≠0 and y≠0; when m, m', n, and n'=0, $X_1 \neq X_3$ or $X_2 \neq X_4$ when m, m', n, and n'≠0, Ar≠Ar';
    a first electron acceptor which is a crystalline material, wherein self-molecule stacking distance of the first electron acceptor is less than 4 Å; and
    a second electron acceptor which is a crystal destruction material, wherein the second electron acceptor includes a fullerene derivative.

2. The organic semiconductor mixed material of the claim 1, wherein the first electron acceptor includes IT-4F (3,9-bis(2-methylene-((3-(1,1-dicyanomethylene)-6,7-difluoro)-indanone))-5,5,11,11-tetrakis(4-hexylphenyl)-dithieno[2,3-d:2',3'-d']-s-indaceno[1,2-b:5,6-b']dithiophene).

3. The organic semiconductor mixed material of the claim 1, wherein the first electron acceptor includes an A-DAD-A non-fullerene organic material based on fused ring of DAD structure with benzothiadiazole as core.

4. The organic semiconductor mixed material of the claim 3, wherein the first electron acceptor includes Y6.

5. The organic semiconductor mixed material of the claim 1, wherein the first electron acceptor includes DTSC-4F.

6. The organic semiconductor mixed material of the claim 1, wherein the second electron acceptor includes PCBM.

7. The organic semiconductor mixed material of the claim 1, wherein the weight percentage of the second electron acceptor in the organic semiconductor mixed material is not more than 15%.

8. An organic photoelectric device comprising:
- a first electrode including a transparent electrode;
- a first carrier transfer layer;
- an active layer which at least comprises an organic semiconductor mixed material of the claim 1;
- a second carrier transfer layer; and
- a second electrode;
- wherein the first carrier transfer layer is disposed between the first electrode and the active layer, the active layer is disposed between the first carrier transfer layer and the second carrier transfer layer, and the second carrier transfer layer is disposed between the active layer and the second electrode.

9. The organic photoelectric device of the claim 8, wherein the first electron acceptor of the organic semiconductor mixed material includes at least one of IT-4F, Y6 and DTSC-4F.

10. The organic photoelectric device of the claim 8, wherein the second electron acceptor of the organic semiconductor mixed material includes PCBM.

\* \* \* \* \*